(12) United States Patent
Shipway

(10) Patent No.: US 9,175,182 B2
(45) Date of Patent: Nov. 3, 2015

(54) INK

(71) Applicant: Andy Shipway, Jerusalem, IL (US)

(72) Inventor: Andy Shipway, Jerusalem, IL (US)

(73) Assignee: DIP-TECH LTD., Kfar Saba (IL)

( * ) Notice: Subject to any disclaimer, the term of this patent is extended or adjusted under 35 U.S.C. 154(b) by 97 days.

(21) Appl. No.: 13/767,030

(22) Filed: Feb. 14, 2013

(65) Prior Publication Data

US 2013/0220684 A1 Aug. 29, 2013

Related U.S. Application Data

(60) Provisional application No. 61/604,514, filed on Feb. 29, 2012, provisional application No. 61/659,039, filed on Jun. 13, 2013.

(51) Int. Cl.
| | | |
|---|---|---|
| C09D 11/02 | (2014.01) | |
| C09D 11/52 | (2014.01) | |
| H05K 1/09 | (2006.01) | |
| C09D 11/037 | (2014.01) | |
| C09D 11/32 | (2014.01) | |

(52) U.S. Cl.
CPC .............. *C09D 11/52* (2013.01); *C09D 11/037* (2013.01); *C09D 11/32* (2013.01); *H05K 1/092* (2013.01)

(58) Field of Classification Search
CPC ................................ C09D 11/30; C09D 11/52
USPC ........................................................ 106/31.92
See application file for complete search history.

(56) References Cited

U.S. PATENT DOCUMENTS

| | | | |
|---|---|---|---|
| 5,743,946 A * | 4/1998 | Aoki et al. .................. | 106/31.95 |
| 2010/0189901 A1* | 7/2010 | Chung et al. .................. | 427/256 |
| 2012/0129332 A1* | 5/2012 | Reddington et al. .......... | 438/610 |
| 2014/0186596 A1* | 7/2014 | Shipway ...................... | 428/209 |

* cited by examiner

*Primary Examiner* — Veronica F Faison
(74) *Attorney, Agent, or Firm* — Jeffrey S. Melcher; Manelli Selter PLLC

(57) ABSTRACT

Silver carbonate decomposes to form silver metal by a temperature of 280 degrees Celsius. Its use in inkjet ink allows the low-cost production of conductive metallic inks. The silver metal layer could be further processed to enhance silver decorative properties and in particular light reflective properties.

9 Claims, No Drawings

INK

FIELD

Examples described herein relate generally to a decorative and conductive ink.

BACKGROUND

Inkjet printing of electrically conductive patterns has been known for some time. The printing process includes the distribution of ink containing conductive particles, polymers, or precursors, across a surface of a substrate. In some cases, a post-treatment such as sintering or plating is necessary to achieve the desired conductivity. The electronics industry uses such inks to form conductive traces on substrates carrying different components. The conductive particles used in ink formulations are of different sizes and depend on the type of printing used. Ink formulations used in inkjet printing usually have properties and particle sizes suitable for ejection from an inkjet head.

Recently, conductive metal micron and sub-micron particles have become of use in the formulation of conductive inkjet inks. Suitable metal particles are silver, gold, copper, palladium, nickel, platinum, and various silver alloys. The size of the particles varies from few microns to around 5 nm. Silver is a precious noble metal with favorable properties such as the highest electrical and thermal conductivity and the lowest contact resistance of all metals, and for this reason it is the most widely used material for conductive inks used in printable electronics. It has a high conductivity, excellent environmental stability, and a lower cost than other noble metals including gold.

Metal particle-loaded inks also find use for decorative printing purposes. Different color and light reflecting or dispersing patterns could be printed using such inks. For example, gold particle-loaded inks faithfully reproduce gold color. Particles in the range of 5-50 nm can produce vivid colors (e.g. red from gold and yellow from silver) on account of their strong surface plasmon absorption band. When the decorative patterns are printed digitally, for example, using inkjet printing methods, the inks should have properties suitable for ejection from an inkjet head.

Cost is a consideration in both conductive and decorative pattern printing, since the production of metal particles cannot be accomplished by typical milling procedures, so more technically sophisticated and expensive methods are required to produce the particles, such as condensation from vapor, precipitation from solution, or etching from an alloy. This results in inks that are more expensive than regular pigment-loaded inks, and are also more expensive than the silver pastes that can be used e.g. for screen-printing and conductive adhesives.

BRIEF SUMMARY

The present ink compositions include micron and sub-micron particles that are useful for the production of electrically conductive features. The compositions could be deposited on a variety of substrates and processed into electrically conductive and decorative patterns such as optically reflective or light dispersing patterns at relatively high temperatures. The compositions can be deposited on a variety of substrates using different methods including conventional and direct-write methods, such as those provided by inkjet devices.

The particles in the present ink compositions are nominally silver carbonate particles. Certain amounts of silver oxide, silver hydroxide and metallic silver could also be present in the ink. These compounds do not affect the ability of the ink to form conductive layers, even if they are present in large amounts. In concept the inks disclosed herein could be entirely based on silver oxide or silver hydroxide in place of silver carbonate, however, silver oxide is a reactive material that is unstable towards easily oxidized materials, atmospheric carbon dioxide, and light—and silver hydroxide is also relatively unstable and difficult to prepare.

After deposition onto a substrate, the ink composition containing silver carbonate particles is heat treated or processed. This heat-treatment causes it to undergo a number of heat-facilitated transformations gradually changing the particles' chemical structure and conductivity, as well as making changes to the other components of the ink, making the properties of the final ink layer similar to the properties of bulk silver metal. The properties could be such as electrical properties, mechanical properties, optical properties, and other properties.

The jettable ink composition among other ingredients includes silver carbonate. Following ink deposition the substrate with deposited on it pattern is heated. At temperature of about 220 degrees Celsius, silver carbonate decarboxylates releasing carbon dioxide ($CO_2$) to give silver oxide. It further undergoes spontaneous reduction at temperatures exceeding 280 degrees Celsius, to release oxygen and yield silver metal. At temperatures between approximately 200 and 350 degrees Celcius, organic materials are decomposed and/or oxidized. While silver carbonate is an electrical insulator, silver oxide is a semiconductor (resistivity ~10,000 Ωm) and silver metal is a conductor (resistivity ~16 nΩm).

Unlike relatively malleable silver metal, silver carbonate is a non-metallic crystalline compound that could be milled by well-known low-cost mechanical methods such as bead-milling and jet-milling. It is chemically stable and non-oxidizing (unlike e.g. silver nitrate, silver acetate or silver oxide), does not easily stain the skin (unlike e.g. silver nitrate and silver acetate) and has a very low solubility (unlike silver nitrate and most silver carboxylates). It also has a relatively low light-sensitivity (unlike e.g. silver phosphate or silver halides) and decomposes at a temperature suitable for glass processing (unlike e.g. silver sulfide, silver sulfate, silver phosphate or silver halides). Silver carbonate is a fundamental compound of silver and has many industrial uses, it is easily and widely available, and its price (atom-to-atom) is close to on parity with bulk silver metal.

Further, silver carbonate has a lower bulk density (6.1 g/mL) than silver metal (10.5 g/mL). Inkjet inks containing particles can be unstable on account of the settling of particles, potentially resulting in shortened shelf-life; poor print quality, or mechanical failure of the printer. Since settling time is typically proportional to the density difference between the particle and the suspending fluid, silver carbonate particles can be expected to settle significantly slowly than silver metal particles of the same size.

The invention relates to an ink composition comprising:
  20% to 80% by weight of silver carbonate particles, the silver carbonate being in an equilibrium with silver oxide and carbon dioxide;
  0.5% to 10% by weight of dispersant;
  20% to 70% by weight of vehicle;
  0.5% to 5% by weight of binder; and
  0.05% to 2.0% by weight of other additives, wherein the ink composition is formulation so that when fired to a temperature of 300° C. to convert the silver carbonate to silver metal and adhere the silver metal to a surface organic materials present in the composition are partially or fully decomposed and removed from the silver metal, and the % by weight being based on the total weight of the composition.

The invention also relates to a method comprising:
depositing on surface of a substrate a layer of ink the ink containing at least silver carbonate particles; and
firing the substrate at a temperature and time sufficient to change at least the conductivity of the layer of ink.

DETAILED DESCRIPTION

Conductive inks and pastes are common in the market. Typically, they are deposited on a substrate by screen printing. The inks contain relatively large conductive metal particles the size of which could exceed 20-30 micron. Production of such particles by milling or other methods is not problematic and does not involve excessive cost.

In ink jet printing ink droplets are ejected towards the substrate through nozzles. The diameters of the nozzles of commercially available inkjet printheads are usually in the range of 15-25 micron and use of inks containing such large size metal particles would clog the nozzles rendering them inoperative. Commercially available inkjet inks contain much smaller conductive metal and in particular conductive metal particles of sub-micron size. Silver, gold, palladium, copper, and similar metals are relatively soft metals and their milling to such small size particles is not feasible. Typically they are prepared by methods such as wet chemical precipitation from silver salt solutions, or condensation from evaporated metal. These processes are proprietary, time consuming, and costly.

Conductive and decorative coatings deposited on at least a portion of a glass or ceramics substrates for example, a glass substrate such as a glass sheet, automotive glass, architectural glass, dinnerware, household appliance panels, artistic ceramics, and similar are fixed to these substrates by firing the coated substrates at high temperatures. The present ink and inkjet conductive and decorative coating printing process are taking advantage of the high-temperature firing post-printing processes used to adhere the deposited coating to the substrate, and to remove by decomposition the organic components of the ink.

The ink is composed of silver carbonate. However, it is noted that silver carbonate exists in an equilibrium with silver oxide and carbon dioxide, so depending on the conditions and history of the ink or composition, a certain amount of silver oxide could also be present. Certain amounts of silver hydroxide and metallic silver could also be present in the ink. These compounds do not affect the ability of the ink to form conductive layers, even if they are present in large amounts. In concept the inks disclosed herein could be entirely based on silver oxide or silver hydroxide in place of silver carbonate, but silver oxide is a reactive material that is unstable towards easily oxidized materials, atmospheric carbon dioxide, and light—and silver hydroxide is also relatively unstable and difficult to prepare.

Further, silver carbonate has a lower bulk density (6.1 g/mL) than silver metal (10.5 g/mL) or silver oxide (7.14 g/mL). Inkjet inks containing relatively heavy particles could be unstable on account of the settling of particles, potentially resulting in shortened shelf-life; poor print quality, or mechanical failure of the printer. Since settling time is typically proportional to the density difference between the particle and the suspending fluid, silver carbonate particles could be expected to settle significantly more slowly than silver metal particles of the same size.

The material, silver carbonate, decarboxylates to release carbon dioxide ($CO_2$) at a temperature about 220 degrees Celsius and further undergoes spontaneous reduction at a temperature of about 280 degrees Celsius, to yield silver metal (Ag) and oxygen.

Silver carbonate is a crystalline non-metallic compound that is milled easily (unlike silver metal), and it is chemically stable and non-toxic (unlike e.g. silver nitrate or silver oxide). Since silver carbonate is a basic compound of silver and has many industrial uses, it has easy and wide availability, and its price (atom-to-atom) is close to on parity with bulk silver metal. It also has low light-sensitivity (unlike e.g. silver phosphate or silver halides) simplifying packaging and storage and decomposes at a temperature suitable for glass processing (unlike e.g. silver sulfide, silver sulfate, silver phosphate or silver halides).

The ink composition in addition to silver carbonate could include other ingredients such as liquid vehicle, dispersants, rheology and surface tension modifiers, adhesion promoters, leveling agents, binders, and stabilizers.

Ink Composition Ingredients Selection
Vehicle Selection

Ink-jet inks are commonly formulated to contain a large proportion of a mobile liquid vehicle. The current inkjet ink compositions could contain organic compounds such as for example, Dipropylene Glycol Monomethyl Ether (DPM). The organic compounds could evaporate, decompose or even burn out at certain temperatures.

The liquid vehicle is selected for properties including its viscosity, safety, chemical stability, cost, and vapor pressure. The vehicle is also selected not to allow the ink to dry in the inkjet print-heads to such an extent that the heads become clogged. However, it is the vehicle that will evaporate upon heating of the printed ink to approximately 120 degrees Celsius, sufficiently to leave a layer that is robust to handling prior to the full heat-treatment. Consequently, the liquid vehicle could be a mixture of components.

Vehicle components could include glycol ethers, alcohols and their esters of varying lengths, for example as marketed by The Dow Chemical Company, U.S.A under the Dowanol trade name. Other components may include ketones such as cyclohexanone, water, alkanes, oils, and paraffins.

Dispersant Selection

Silver carbonate is less dense than silver metal, but is still a dense material with specific weight of about 5.5 g/cm$^3$, so it could be difficult to stabilize it in a dispersion. It contains 78% silver by mass. Therefore, high solids dispersion can still have a low volume ratio of silver metal. At the same time, high solids dispersion will make a high density ink, which may be problematic.

The vehicle is evaporated at a temperature lower than that which will chemically alter the other organic components or the silver carbonate, and this evaporation takes place in a "drying" step prior to the higher temperature treatment 'firing' of the ink layer. However, the decomposition temperature of the silver carbonate is similar to the decomposition temperature of the dispersant(s) and other organic components, which could decompose in several steps during the heat-treatment process. Because of this, the dispersant and other additives could be expected to have an effect on the properties of the final heat-treated ink layer. For example, decomposition may take place in individual stabilized particles, producing silver nanoparticles in situ that are later sintered after the dispersant is decomposed. Nanoparticles of less than 50 nm offer the possibility to be sintered at low temperatures on account of their high surface area, which could be an advantage in certain applications. The organic components could also have an effect on the timing and interaction of the newly reduced metal atoms with the glass surface. Thus, the choice of proper dispersant and other additives facilitates the production of a high quality ink.

Most of the dispersants examined were acidic polymers or salts of acidic polymers, because of their ability to bind (and even react with) the silver carbonate particle surface. Silver carboxylate salts are insoluble and decompose by an analogous mechanism (and similar temperature) to silver carbonate, so their presence is not detrimental to the ink. "Controlled flocculation" dispersants (such as Bykumen) could also be suitable on account of their ability to stabilize dispersions against settling.

Acidic dispersants such as Disperbyk™-111 (DB-111) and Disperbyk™-220S (Disperbyk is a trademark of Byk Chemie of Wesel, Germany) were found to give dispersions that settled more slowly than acid salt dispersants. Some formulations including these dispersants were more difficult to redisperse. The "controlled flocculation" dispersant Disperbyk™-220S (DB-220S) in particular was more resistant to redispersal. Of the acid salt dispersants, Disperbyk™-106 (DB-106) was superior to Disperbyk™-180 (DB-180) both in speed of settling and in redispersability. Stearic acid ($CH_3(CH_2)_{16}CO_2H$) gave the most stable dispersion and was easier than the other acid dispersants to redisperse after settling for a short period.

Candidate dispersions using Disperbyk™-106, Disperbyk™-111, Disperbyk™-180 (DB-180) and stearic acid were used to produce fired samples. The adhesion and color viewed from the back were found to be dependent on the dispersant. The stearic acid sample gave poor adhesion (failed the adhesion test) though the color of the resulting silver was good and had a light hue. Disperbyk™-111 gave a darker color and slightly stronger adhesion than Disperbyk™-106. Mixing Disperbyk™-111 (DB-11) with Disperbyk™-106 (DB-106) gave dispersion with generally poor qualities.

The adhesion strength of the silver film formed was found to be dependent on the dispersant concentration. Considering DB-106, a slurry with no dispersant resulted in low adhesion (failed adhesion test). At 7.5% DB-106 (w/w relative to silver carbonate) the adhesion became comparable to that obtained with 5% of DB-111. This increase also led to a decrease in redispersibility, though it remained better than redispersibility with DB-111.

Frit Selection

In order to provide the final ink layer with high adhesivity to the substrate and high scratch-resistance, glass frit or other inorganic fillers could be included in the formulation. Ideally such a frit melts below the processing temperature of the ink. Some frits could be specifically formulated for an application, for example the frit commonly used in silver pastes for the photovoltaic industry which performs the function of removing silicon nitride from the solar cell surface.

A bismuth-based glass frit was found to significantly increase the adhesivity of silver formed from silver carbonate in the case where the formulation otherwise provided poor adhesivity. This improvement was noted at a 0.5% to 10% concentration of glass frit, but at higher levels of glass frit concentration the resistivity of the resulting silver layer was also increased.

Milling Process Selection

The milling of silver carbonate is simple in principle since it is a friable crystalline material, however it is difficult to achieve particle sizes suitable for inket printing on account of its facile decomposition. Silver carbonate commercially available from Tianjin Yinlida Chemicals Co., Ltd., Tianjin China was used in tests Milling was conducted in the presence of a dispersant. The millbase consisted of 60-70 wt % solids in formulations including a dispersant and 50 wt % solids in other formulations. Dispersant, for example, Disperbyk-116 was used at 4 wt % concentration relative to silver carbonate, and the mass of milling beads (Zirconia milling beads with diameter of 0.4-0.6 mm) was about the same as the mass of the millbase. The milling was conducted in a light-tight environment. The duration of the milling process varied from two hours to four days. Samples were diluted into DPM and agitated before particle size measurements were made. The mill speed was from 500 rpm to 2000 rpm. The process resulted in particles with sizes below 1.7 micron with the bulk of particles below 1.0 micron.

Milling was examined under various conditions, and it was found that water and acetone also offer a reasonable solvent vehicle to obtain low particle sizes. Milling in water is preferable if the primary aim is the maximum possible particle size reduction, but it must be later removed if the silver carbonate particles are to be used in an organic formulation. For example, silver carbonate particles with size of about 1.0 micron (with 90% of the particle volume below 1.3 microns and 99% below 1.7 microns) was achieved using the following ingredients and milling conditions:

Millbase of about 50% silver carbonate, about 50% deionized water and about 1% PVP (10 k).

Zirconia milling beads with average diameter of 0.3 mm diameter.

A milling intensity (about 800 rpm) that does not cause a temperature rise of more than 5 C.

A mixture of silver carbonate (30 g), water (deionized, 30 g) zirconia milling beads (0.3 mm, 60 g) and PVP (MW=10 k, 0.45 g) were milled at 800 rpm using an eccentric disc impeller in a 100 mL plastic pot. The mixture was protected from light. Milling was carried out for 115 hours, after which the mixture color had changed from bright yellow, original color of silver carbonate powder, to light brown. At this point, 20 mL of acetone was added and a small sample was taken. The sample was filtered and washed with acetone, then the sample was dispersed by sonication into a 1% solution of Disperbyk-116 in DPM. The particle size in this sample was measured by a a laser particle sizing instrument Fritsch Analysette, commercially available from Fritsch, GmbH, Idar—Oberstein Germany.

Other parameters that could be of help in achieving small particle size were: a) Addition of a small amount of an oxidizing agent as permitted by the rest of the system (e.g. potassium permanganate or potassium sulfide); b) Addition of a non-oxidizable cosolvent (e.g. acetone, MEK, PGDA) to provide a suitable viscosity and surface tension; c) Addition of a suitable dispersant to reduce viscosity and inhibit flocculation (a dispersant which does not contain oxidizable groups such as alcohols and phenols).

Similar particle sizes were obtained by using "in-house" produced silver carbonate.

Additive Selection

In order to provide an ink with appropriate physical properties for inkjet printing onto glass, the hydrophobicity and surface tension of the ink must be appropriate. Certain additives designed to control these properties are therefore added to the ink composition. Additional materials may be added to improve e.g. leveling behavior. Many additives are available from various suppliers to perform these tasks.

Specifically, Byk-341 can be used with silver carbonate-based inks to reduce surface tension, and Byk-358 available from BYK-Chemie GmbH, Germany can be used to improve leveling behavior.

Binder Selection

After printing and prior to the heat treatment (firing), a lower temperature "drying" step is performed. This removes the majority of the liquid vehicle, preparing the ink layer for firing, and leaves the ink layer robust and dry enough for required handling ("green" layer). In order to maximize this robustness, a binder may be included in the ink composition in a low concentration. As with the other organic components of the ink, its selection could be made carefully in order to ensure that the properties of the fired ink will be optimal.

At a concentration of 2%, the aldehyde resin Laropal A-81 commercially available from BASF Aktiengesellschaft, Germany provides a "green" scratch resistance close to 8B (suitable for the required handling) without causing a large increase in viscosity of the ink. PVP (polyvinylpyyrolidone, MW 10,000) gave similar results. PVB (polyvinyl butyral) and methyl cellulose binders give less impressive scratch resistance of the unfired, dried layer. However, all these four binders provide inks that result in a high adhesion of the final silver layer to the glass. In contrast, the acrylic binder Paraloid B-66 commercially available from Rohm and Haas, USA, commonly used in this kind of ink, provides an ink that results in poor adhesion of the silver layer to the glass after firing.

Heat Processing (Firing)

After printing and prior to full heat processing (firing), samples are dried. This is typically conducted at 120 degrees Celsius for a time of about 10 minutes. This drying process removes volatile components, reducing the content of organic materials from more than 40% to less than 20% in preparation for the firing process. Drying stabilizes the layer structure with respect to e.g. settling or aggregation of the particles and to spreading of the ink on the surface. Drying also improves the mechanical strength of the unfired ink (known as "green strength"), providing robustness in handling, e.g. during short-term storage, loading and unloading, and transit between processing machines.

Firing involves heat treatment above 300 degrees Celsius, which partially or fully decomposes and removes organic materials from the ink layer, and decomposes and fuses the silver carbonate to form a conductive layer. Firing is typically used in the glass industry to temper glass and/or to shape glass (e.g. to provide curved sheets). These processes typically take place at temperatures of 550-700 C and on timescales of several minutes. In commercial manufacturing, the firing process to temper and/or shape the glass is the same as the process used to form the conductive layer; both take place simultaneously and only a single firing process is required.

Fired Ink Layer Testing Procedures

The physical properties of the inks were measured using the following techniques: Testing of the adhesion of the fired silver ink layer to the substrate was performed by rubbing the layer with a small (~2 cm$^2$) wad of steel wool at least 20 times in a circular motion with a load of approximately 300 g.

Scratch testing was performed using an Elcometer 3092 sclerometer available from Elcometer Limited, Manchester UK set at 20N (Blue spring) or 30N (Green spring) force. The sample was considered to "pass" in the case that the sclerometer did not remove silver from the substrate (i.e. did not scratch all the way through the silver layer), even if the surface was marked.

The electrical resistance of fired silver layers obtained with different ink formulations was tested with a simple two-probe digital multimeter. The probes were pressed onto the sample surface at a separation of about 5 cm. Readings of 1.5 Ohm or less were considered to be a "pass" as this represents approximately the contact resistance of the probes with the surface.

The reflectance of fired and polished silver layers obtained with different ink formulations was measured at different incident angles using red HeNe laser (Wavelength 632 nm.). The measured reflectance was higher than 90%.

Viscosity may be measured using a Brookfield DV1 low-viscosity viscometer running at 20 rpm at 25° C. with spindle 00. Ink-jet inks exhibit a desirable low viscosity of less than 50 mPas and ideally 10-25 mPas. Ink compositions with viscosity higher than 200 mPas could be used for example, in screen printing.

The following ink compositions represent examples of the ink. They are presented to explain the compositions in more detail, and do not limit the ink to the presented compositions.

Example 1

A small (8.25 g) amount of silver carbonate powder was ground in a mortar and pestle such that the final size of the silver carbonate particles was approximately 2 micron. A dispersion of 70% solids could readily be prepared, and a dispersion of about 50% solids appears suitable as an ink on the basis of viscosity. The dispersion containing at least silver carbonate particles was deposited by draw-down on surface of a glass substrate. The drawn-down samples dry to a brown color with varying darkness. Without being bound to a specific theory, it is believed that certain amount of silver oxide and/or silver metal could be formed in the drying stage. Silver oxide is black in color and could cause the varying darkness.

The samples were fired at a temperature of about 650 degrees Celsius for a time of approximately 2 minutes. This firing time was sufficient to change at least the conductivity of the layer of ink making it higher than the green layer conductivity.

After firing the samples had a white or off-white surface color and were dispersing incident light (i.e. had matte appearance). This is likely micro or nano-structured silver, as is also observed when objects are electroplated with silver. After being polished, this white surface revealed a shiny light-reflecting silver surface. The polishing medium was a slurry prepared from submicron glass frit with Disperbyk-180 in a mixture of DPM and water.

The appearance of the backside of the sample after firing shows a strong dependence on the side of the glass that the ink was applied to. The glass used was float glass manufactured according to the "Pilkington process", in which one side is in contact with air during the casting and the other side is in contact with molten tin. When the ink is applied to the "air side", the color is off-white, while ink on the "tin side" results in a much darker coppery color. Thicker ink layer results in a darker color, possibly as a result of trapped organic vehicle decomposition products or silver oxide. The "orange halo" effect noted in other existing silver inks is not observed, but if the silver layer is removed, the glass underneath is stained orange (and in some cases seems to have an interference reflection in the blue part of the spectrum).

Samples from dispersions of 46% silver carbonate (36% silver w/w) drawn down with a 24-micron knife produced an average fired silver layer thickness of about 2 microns. The silver layers produced have been "semitransparent", yet still passed the adhesion and conductivity tests.

Example 2

8.25 g of finely ground silver carbonate powder (available from Aldrich Chemical Company, Milwaukee, Wis. USA) and 3.48 g of DPM were sonicated and shaken together for 10 minutes. The result was a slurry containing 70% silver carbonate (w/w). When the dispersant DB-106 was added to this mixture at a concentration of about 5% w/w, it resulted in an ink that gave excellent homogeneous film-forming ability and could be easily polished post-firing for a time of about 10 minutes to achieve a highly reflective silver surface. The reflective silver surface had also higher conductivity, than the "green" layers had. The resistivity of the layer of ink of metal silver was less than ten times the resistivity of bulk silver metal.

This ink passed the adhesion, 20N force scratch, and conductivity tests described above.

Example 3

A low solid content, high stability ink was prepared using 6.0 g of silver carbonate powder and 3.0 g DPM. The ground and mixed ingredients were sonicated and shaken together for about 5 minutes. The resulting slurry was allowed to settle for about 10 minutes, and then was gently rocked twice to an angle of 45 degrees. This process allowed the settling of large particles. After repeating this procedure 3 times, the slurry was decanted, leaving the larger particles behind. A fifth of this remaining slurry was taken and added to 2.0 g DPM and about 0.05 g of DB-111 to achieve an ink containing approximately 25% w/w solids (20% w/w silver). This ink composition had good stability to settling, and formed an excellent uniform film when spread at a layer with thickness of about 40 microns, resulting after firing for about 2 minutes at a temperature of about 650 degrees Celsius in a silver layer that had a higher conductivity and could be polished to a high reflectivity and passed the adhesion and conductivity tests. The resistivity of the layer of ink of metal silver was less than ten times the resistivity of bulk silver metal.

Example 4

This is a high-adhesion ink composition prepared by using 2.7 g of the slurry described in Example 2, mixed with 1.42 g of a 10% solution of DB-106 in DPM, to achieve an ink containing 46% w/w solids (about 36% w/w metal silver). This ink is stable for a limited period, but is easily redispersible. The ink composition was drawn at different thicknesses on a glass substrate it formed a silver layer that after firing could not be easily removed even by rubbing with metallic mesh scourer, although the applied layer was relatively a thin 24 microns layer. The layer passed the scratch test at 30N, as well as the adhesion test and the conductivity test. The resistivity of the layer of ink of metal silver was less than ten times the resistivity of bulk silver metal.

The ink and the method described could find use for inkjet printing on glass, specifically to achieve conductivity, and more specifically to allow the printing of rear-window demisters for the automotive industry. However, other applications for conductive printing on glass exist, such as RFID tags, GPS and radio antennas, sensors, power transfer in lighting, etc.

In addition, polishing the deposited and fired layer results in a shiny silver surface that has applications for decoration. Thin semitransparent silver layers could be used for IR-reflectance in semitransparent windows, i.e. for "cool window" applications.

The technology does not need to be limited to silver—other noble metals could be processed in an analogous way, for example using gold(I)chloride (decomposes to form gold metal at 298 degrees Celcius), or platinum(II)chloride (decomposes to give platinum metal), or palladium acetate or palladium(II)chloride (decompose to give palladium metal). Osmium(IV) compounds such as the oxide and chloride could similarly decompose to form osmium metal. The substrate also does not need to be limited to glass, and can be extended to metals and ceramic substrates (that can survive the high-temperature firing). Finally, the process methodology does not need to be limited to inkjet printing, since it is relevant to e.g. screen-printing, flexographic printing, roller-coating and even hand-painting.

In the decorative arena, an ink could have additional components. For example, and ink which contains silver carbonate together with other pigments could be used to achieve e.g. iridescent or metallic effects.

While the method of forming a conductive and decorative substrate coating has been described in conjunction with the specific examples outlined above, it is evident that many alternatives, modifications and variations will be apparent to those skilled in the art. Accordingly, the examples as set forth above are intended to be illustrative, not limiting. Various changes may be made without departing from the spirit and scope of the examples as defined in the following claims.

What is claimed is:

1. An ink composition comprising prior to firing at least 20% by weight of silver carbonate and at least 14% by weight of metal silver after the firing to a temperature of at least 280° C., based on the total weight of the ink composition.

2. An ink composition comprising:
   20% to 80% by weight of silver carbonate particles, the silver carbonate being in an equilibrium with silver oxide and carbon dioxide;
   0.5% to 10% by weight of dispersant;
   20% to 70% by weight of vehicle;
   0.5% to 5% by weight of binder; and
   0.05% to 2.0% by weight of other additives, wherein the ink composition is formulation so that when fired to a temperature of 300° C. to convert the silver carbonate to silver metal and adhere the silver metal to a surface organic materials present in the composition are partially or fully decomposed and removed from the silver metal, and the % by weight being based on the total weight of the ink composition.

3. The ink composition according to claim 2, wherein the size of silver carbonate particles is less than 2 micron (before firing).

4. The ink composition according to claim 2, wherein silver carbonate particles settle significantly more slowly than silver metal particles of the same size.

5. The ink composition according to claim 2 further comprising at least 0.5% glass frit and wherein the glass frit is a bismuth-based.

6. The ink composition according to claim 5 wherein the bismuth-based glass frit increases adhesivity of silver formed from silver carbonate.

7. The ink composition according to claim 2 wherein the binder of the ink containing at least silver carbonate particles is an aldehyde resin.

8. The ink composition according to claim 2, wherein the ink composition is formulated to be an inkjet ink.

9. The ink composition according to claim 1, wherein the ink composition is formulated to be an inkjet ink.

* * * * *